US011967587B2

(12) United States Patent
Azeroual et al.

(10) Patent No.: US 11,967,587 B2
(45) Date of Patent: Apr. 23, 2024

(54) IC PACKAGE WITH TOP-SIDE MEMORY MODULE

(71) Applicant: Marvell Israel (M.I.S.L) Ltd., Yokneam (IL)

(72) Inventors: Dan Azeroual, Kiriat Ata (IL); Liav Ben Artsi, Nahariya (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 18/108,520

(22) Filed: Feb. 10, 2023

(65) Prior Publication Data

US 2023/0187423 A1 Jun. 15, 2023

Related U.S. Application Data

(63) Continuation of application No. 16/898,261, filed on Jun. 10, 2020, now Pat. No. 11,581,292.

(Continued)

(51) Int. Cl.
*H01L 25/10* (2006.01)
*H01L 23/00* (2006.01)
(Continued)

(52) U.S. Cl.
CPC ............ *H01L 25/105* (2013.01); *H01L 24/72* (2013.01); *H01L 24/90* (2013.01); *H01L 25/18* (2013.01);
(Continued)

(58) Field of Classification Search
CPC ..................................................... H01L 25/105
(Continued)

(56) References Cited

U.S. PATENT DOCUMENTS

| 1,088,123 A | 2/1914 | Browning |
| 6,366,467 B1 | 4/2002 | Patel et al. |

(Continued)

FOREIGN PATENT DOCUMENTS

EP 3442314 A1 2/2019

OTHER PUBLICATIONS

International Search Report and Written Opinion in International Patent Application No. PCT/IB2020/055471, dated Sep. 14, 2020 (11 pages).

(Continued)

*Primary Examiner* — Ajay Arora

(57) ABSTRACT

A printed circuit board (PCB) system includes an integrated circuit (IC) package having a main IC chip that is electrically coupled to a top surface of a package substrate. A first printed circuit board (PCB) is electrically coupled to first contact structures on a bottom surface of the package substrate. A heat dissipation member is coupled to the main IC chip. A memory module is configured to electrically couple, via an interposer, with second contact structures on a top surface of the package substrate while the heat dissipation member dissipates heat from the main IC chip away from one or more memory IC chips on the memory module. The interposer is configured to electrically couple the second contact structures of the IC package with the memory module while the heat dissipation member dissipates heat from the main IC chip away from the one or more memory IC chips.

20 Claims, 7 Drawing Sheets

Related U.S. Application Data

(60) Provisional application No. 62/859,560, filed on Jun. 10, 2019.

(51) Int. Cl.
*H01L 25/00* (2006.01)
*H01L 25/18* (2023.01)

(52) U.S. Cl.
CPC ........ *H01L 25/50* (2013.01); *H01L 2225/107* (2013.01); *H01L 2225/1094* (2013.01)

(58) Field of Classification Search
USPC ........................................................ 257/686
See application file for complete search history.

(56) References Cited

U.S. PATENT DOCUMENTS

| | | | |
|---|---|---|---|
| 6,884,086 | B1 | 4/2005 | Ruttan et al. |
| 7,095,619 | B2 | 8/2006 | Panella et al. |
| 9,101,068 | B2 | 8/2015 | Yun et al. |
| 9,368,450 | B1 | 6/2016 | Gu et al. |
| 9,640,282 | B1 | 5/2017 | Chen et al. |
| 11,581,292 | B2 | 2/2023 | Azeroual et al. |
| 2001/0046724 | A1* | 11/2001 | Stephenson ......... H01L 23/3107 257/E21.504 |
| 2001/0046742 | A1 | 11/2001 | Jeng |
| 2003/0197285 | A1 | 10/2003 | Strandberg et al. |
| 2003/0222282 | A1 | 12/2003 | Fjelstad et al. |
| 2006/0091507 | A1 | 5/2006 | Fjelstad et al. |
| 2007/0108581 | A1 | 5/2007 | Shim et al. |
| 2007/0108611 | A1 | 5/2007 | Bartley et al. |
| 2009/0197436 | A1 | 8/2009 | Trobough |
| 2009/0321939 | A1 | 12/2009 | Chandrasekaran |
| 2009/0325415 | A1 | 12/2009 | Brist et al. |
| 2010/0065948 | A1 | 3/2010 | Bae et al. |
| 2010/0066393 | A1 | 3/2010 | Bottoms et al. |
| 2011/0042824 | A1 | 2/2011 | Koide |
| 2013/0168854 | A1 | 7/2013 | Karikalan et al. |
| 2014/0117552 | A1 | 5/2014 | Qian et al. |
| 2014/0217571 | A1 | 8/2014 | Ganesan et al. |
| 2014/0273641 | A1 | 9/2014 | Light et al. |
| 2015/0118870 | A1 | 4/2015 | Swaminathan et al. |
| 2015/0171015 | A1 | 6/2015 | Mahajan et al. |
| 2016/0050743 | A1 | 2/2016 | Taguchi |
| 2016/0099197 | A1 | 4/2016 | Uematsu et al. |
| 2016/0240949 | A1 | 8/2016 | Ganesan et al. |
| 2016/0365660 | A1 | 12/2016 | Annis et al. |
| 2017/0092621 | A1 | 3/2017 | Das et al. |
| 2018/0076171 | A1 | 3/2018 | Singh et al. |
| 2019/0051587 | A1 | 2/2019 | Azeroual et al. |
| 2019/0103358 | A1 | 4/2019 | Goh et al. |
| 2019/0244903 | A1 | 8/2019 | Azeroual et al. |
| 2020/0243451 | A1* | 7/2020 | Frantz ..................... G11C 5/04 |
| 2021/0111141 | A1 | 4/2021 | Sauter et al. |

OTHER PUBLICATIONS

U.S. Appl. No. 16/412,978, Azeroul et al., "Package System for Integrated Circuits," filed May 15, 2019.

\* cited by examiner

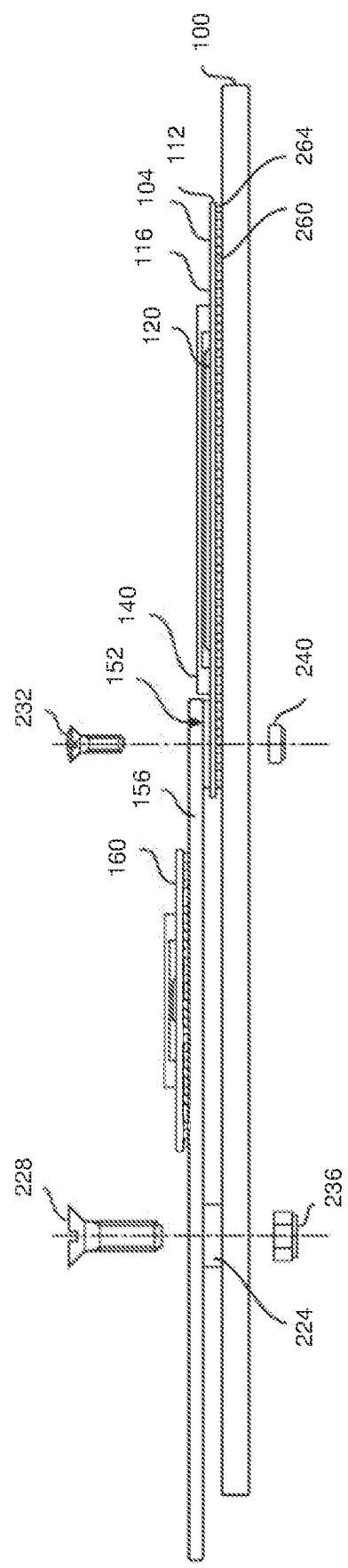

IC PACKAGE WITH TOP-SIDE MEMORY MODULE

CROSS REFERENCES TO RELATED APPLICATIONS

The present application is a continuation of U.S. patent application Ser. No. 16/898,261, filed on Jun. 10, 2020, entitled "IC Package with Top-Side Memory Module," which claims the benefit of U.S. Provisional Patent Application No. 62/859,560, entitled "Ball Grid Array (BGA) Package Upper Connection to Memory Module," filed on Jun. 10, 2019. Both of the applications referenced above are hereby incorporated by reference herein in their entireties.

FIELD OF TECHNOLOGY

The present disclosure relates generally to integrated circuit (IC) packaging technology, and more particularly to IC packages with electrical connections on both a bottom surface and a top surface of the IC package.

BACKGROUND

Integrated circuit (IC) packaging involves a semiconductor die (also referred to as an IC chip) of integrated circuits being covered in a housing that prevents physical damage, corrosion and the like, to the IC chip. Additionally, electrical connection points, such as pins or pads, outside of the housing are provided to allow electrical connections with the IC chip within the housing. The IC chip, the housing, and the electrical connection points are sometimes referred to as an IC package.

A ball grid array (BGA) is a surface-mount IC package in which an array of pads, each with an attached solder ball, on a bottom surface of the BGA package allow the BGA package to be electrically connected to a printed circuit board (PCB). The density of solder balls (sometimes measured by the distance between adjacent balls, (pitch size)) on the BGA package has an upper limit. As a result, for larger more complex IC chips with higher numbers of input/output (I/O) connections that require higher numbers of solder balls, the overall size of the BGA package is increased, which increases the cost of the BGA package.

SUMMARY

In an embodiment, a printed circuit board (PCB) system comprises: a first PCB; an integrated circuit (IC) package comprising: i) a package substrate, ii) a main IC chip that is electrically coupled to a top surface of the package substrate, iii) first contact structures that are disposed on a bottom surface of the package substrate and that are electrically coupled to the first PCB, and iv) second contact structures that are disposed on the top surface of the package substrate; a heat dissipation member coupled to the main IC chip; a memory module comprising: i) a second PCB, ii) one or more memory IC chips that are disposed on a top surface of the second PCB, and iii) third contact structures that are disposed on a bottom surface of the second PCB, the memory module being configured to electrically couple, via an interposer, the third contact structures to the second contact structures of the IC package while the heat dissipation member dissipates heat from the main IC chip away from the one or more memory IC chips; and the interposer, being disposed between the second contact structures of the IC package and the third contact structures of the memory module to electrically couple the second contact structures of the IC package with the third contact structures of the memory module while the heat dissipation member dissipates heat from the main IC chip away from the one or more memory IC chips.

In another embodiment, a method for assembling a PCB system includes: mounting an IC package to a first PCB to electrically couple first contact structures on a bottom surface of a package substrate of the IC package to the first PCB, the IC package including a main IC chip; stacking and aligning a memory module on the IC package, the memory module comprising i) a second PCB, ii) one or more memory IC chips disposed on the second PCB, and iii) second contact structures disposed on a bottom surface of the second PCB; disposing an interposer between the second contact structures disposed on the bottom surface of the second PCB of the memory module and third contact structures; electrically coupling the second contact structures disposed on the bottom surface of the second PCB of the memory module to the third contact structures disposed on a top surface of the package substrate, including interconnecting the second contact structures of the memory module with the third contact structures disposed on the top surface of the package substrate via the interposer; and coupling a heat dissipation member to the main IC chip to dissipate heat from the main IC chip away from the one or more memory IC chips.

BRIEF DESCRIPTION OF THE DRAWINGS

FIGS. 2A-C are different views of the example PCB system of FIG. 1C, according to an embodiment.

DETAILED DESCRIPTION

In embodiments described below, a printed circuit board (PCB) system comprises a first PCB and an integrated circuit (IC) package having i) a package substrate, ii) a main IC chip that is electrically coupled to a top surface of the package substrate, iii) first contact structures that are disposed on a bottom surface of the package substrate and that are electrically coupled to the first PCB, and iv) second contact structures that are disposed on the top surface of the package substrate. The PCB system further comprises a memory module having i) a second PCB, ii) one or more memory IC chips that are disposed on the second PCB, and iii) third contact structures that are disposed on a bottom surface of the second PCB. The PCB system further comprises an interposer disposed between the second contact structures of the IC package and the third contact structures of the memory module to electrically couple the second contact structures of the IC package with the third contact structures of the memory module.

In some embodiments, because some input/output (I/O) connections for the IC chip are disposed on the top surface of the package substrate (e.g., the second contract structures), the number of I/O connections for the IC chip disposed on the bottom surface of the package substrate (e.g., the first contract structures) are lower and thus the overall size of the IC package is reduced as compared to if all I/O connections were disposed on the bottom surface of the package substrate. For example, with ball grid array (BGA) packages, the density of solder balls has a practical upper limit and thus larger numbers of solder balls require larger IC package sizes. Accordingly, in some embodiments in which the IC package uses BGA package technology for the first contact structures, reducing the numbers of first contact structures helps to reduce the overall size of the IC package, thus reducing a cost of the IC package.

Additionally, because the number of I/O connections for the IC chip disposed on the bottom surface of the package substrate (e.g., the first contract structures) are lower (as compared to if all I/O connections were disposed on the bottom surface of the package substrate), the number of wire traces on the first PCB electrically coupled to the first contract structures of the IC package is lower, according to some embodiments. As a result, the complexity of the first PCB is reduced (e.g., the number of layers is reduced) as compared to package substrates in which all I/O connections are disposed on the bottom surface of the package substrate, thus reducing the cost of the first PCB, according to some embodiments.

Figure 1A:
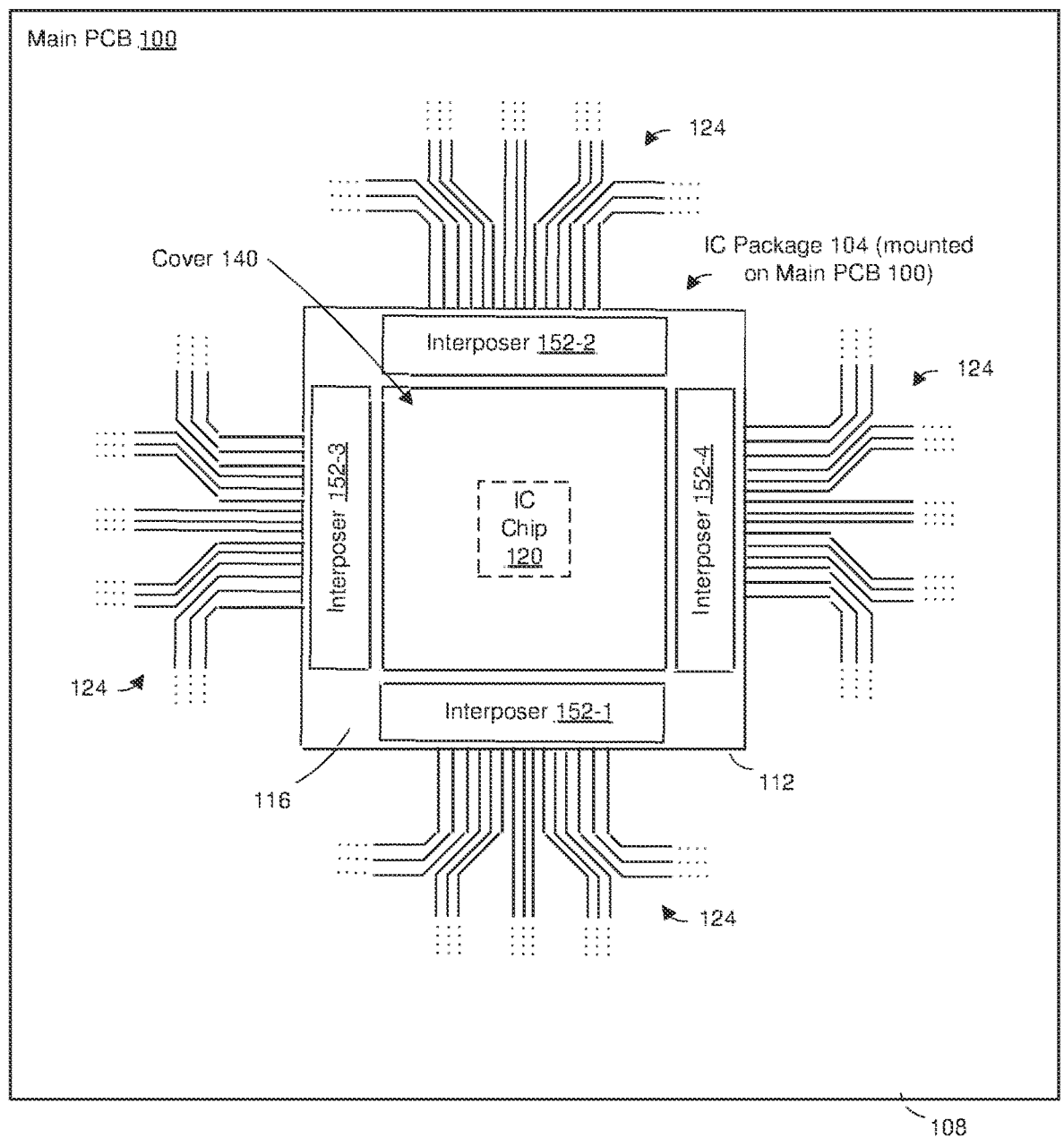
FIG. 1A is a diagram showing a top view of an example printed circuit board (PCB) with an integrated circuit (IC) package disposed on the PCB, according to an embodiment.

FIG. 1A is a diagram showing a top view of an example PCB 100 (sometimes referred to herein as a "main PCB"), according to an embodiment. The PCB 100 includes an IC package 104 mounted on a top surface 108 of the PCB 100, according to an embodiment. The IC package 104 includes a substrate 112 having a top surface 116 and a bottom surface (not shown) opposite the top surface 116. An IC chip 120 is coupled to the top surface 116 of the substrate 112.

The substrate 112 comprises a suitable insulating material (also referred to as dielectric material), such as an epoxy based laminate substrate, a resin-based Bismaleimide-Triazine (BT) substrate, etc., according to various embodiments. The substrate 112 is relatively rigid to provide mechanical support to the IC chip 120. In some examples, the substrate 112 includes multiple layers of metal wire traces, such as copper wires, and the like with the insulating material in between. The wire traces on the different layers are connected by conductive vias in various embodiments.

In an embodiment, electrical contact structures are formed on both the top surface 116 and the bottom surface to electrically interface the IC chip to electronic components that are external to the IC package 120, such as electronic components on the main PCB 100 and electronic components on a memory module to be discussed with reference to FIG. 1B.

The bottom surface of the substrate 112 includes, as electronic contact structures, a plurality of I/O pads (not shown) that permit electrically connecting the PCB 100 to first I/Os of the IC chip 120. In an embodiment, the IC package 104 uses BGA technology, and the plurality of I/O pads (not shown) are disposed in an array, with solder balls (not shown) connected to the plurality of I/O pads.

The IC chip 120 can be any suitable integrated circuit chip, such as for example an integrated circuit processor, controller, transceiver, switching device, system on chip and the like. The IC chip 120 includes various circuits for providing computing and/or processing functionalities. In some examples, the IC chip 120 receives suitable signals, such as analog signals, digital signals, control signals, data signals and the like, from components that are outside of the IC package 104, and processes the received signals. In some examples, the IC chip 120 generates suitable signals, such as analog signals, digital signals, control signals, data signals, and the like, and outputs the generated signals to the components that are outside of the IC package 104.

In an embodiment, the IC package 104 is used in a high speed network switch equipment for packet switching. For example, the IC chip 120 includes a core circuit for packet processing, and peripheral circuits for interface (input/output) processing, such as receiving and/or transmitting signals carrying packets. In an example, the IC chip 120 includes one or more packet processors configured to perform packet processing, including but not limited to packet forwarding. The IC chip 120 further includes interface circuits, such as modulation/demodulation circuits, memory circuit for queuing packets, and the like.

The substrate 112 provides interconnects from the inputs/outputs of the IC chip 121 to the contact structures that are formed on the bottom surface and the top surface 116 of the substrate 112. The IC chip 120 includes I/O pads (not shown) that are electrically connected to internal circuits that are formed on the IC chip 120, and the top surface 116 of the substrate 112 includes solder bumps (not shown) that match the bump-out structures on the IC chip 120, according to an embodiment. The IC chip 120 is disposed on the top surface 116 such that the bump-out structures on the IC chip 120 are aligned with the solder bumps on the top surface 116 of the substrate 112. Then, a reflow process is performed to form connections of the bump-out structures and the solder bumps.

In other embodiments, the IC chip 120 is wire-bonded to form electrical connections with the substrate 112.

The PCB 100 includes a plurality of pads (not shown) disposed on the top surface 108 of the PCB 100 that correspond in position with, and are electrically connected to, the plurality of I/O pads (not shown) on the bottom surface of the IC package 104. In an embodiment in which the IC package 104 uses BGA technology, the plurality of pads (not shown) disposed on the top surface 108 of the PCB 100 are electrically connected to the plurality of I/O pads (not shown) on the bottom surface of the IC package 104 using a plurality of solder balls.

The PCB 100 also includes a plurality of wire traces 124 that are electrically coupled to the plurality of pads (not shown) disposed on the top surface 108 of the PCB 100, and which are electrically connected to the plurality of I/O pads (not shown) on the bottom surface of the IC package 104. The wire traces 124 electrically couple other electronic components (not shown) disposed on the PCB 100 to the first I/Os of the IC chip 120.

The IC package 104 further includes a cover 140 that covers the IC chip 120 while leaving peripheral portions of the top surface 116 of the substrate 112 uncovered. In an embodiment, the cover 140 comprises a heat slug that facilitates heat dissipation from the IC chip 120 during operation. In some embodiments, the cover 140 comprises a metal material that covers the IC chip 120, for example to protect IC chip 120 and to aid in heat dissipation during operation when the IC chip 120 is powered on.

A plurality of interposers 152 are disposed on the top surface 116 of the substrate 112 of the IC package 104. In an embodiment, each interposer 152 comprises a plurality of contact structures that are electrically connected to a plurality of traces (not shown) of the substrate 112. The plurality of traces (not shown) of the substrate 112 electrically couple second I/Os of the IC chip 120 with the contact structures of the interposers 152. In an illustrative example, each interposer 152 is comprises a plurality of compression contacts on at least one side of the interposer 152 that permit a memory module (which is described in connection with FIGS. 1B and 1C) to electrically couple to the second I/Os of the IC chip 120, according to an embodiment. For example, the PCB system 100 includes a force component configured to apply compression force to the PCB 100 and the memory module (which is described in connection with FIGS. 1B and 1C) to electrically couple the memory module with the second I/Os of the IC chip 120, according to an embodiment.

Figure 1B:
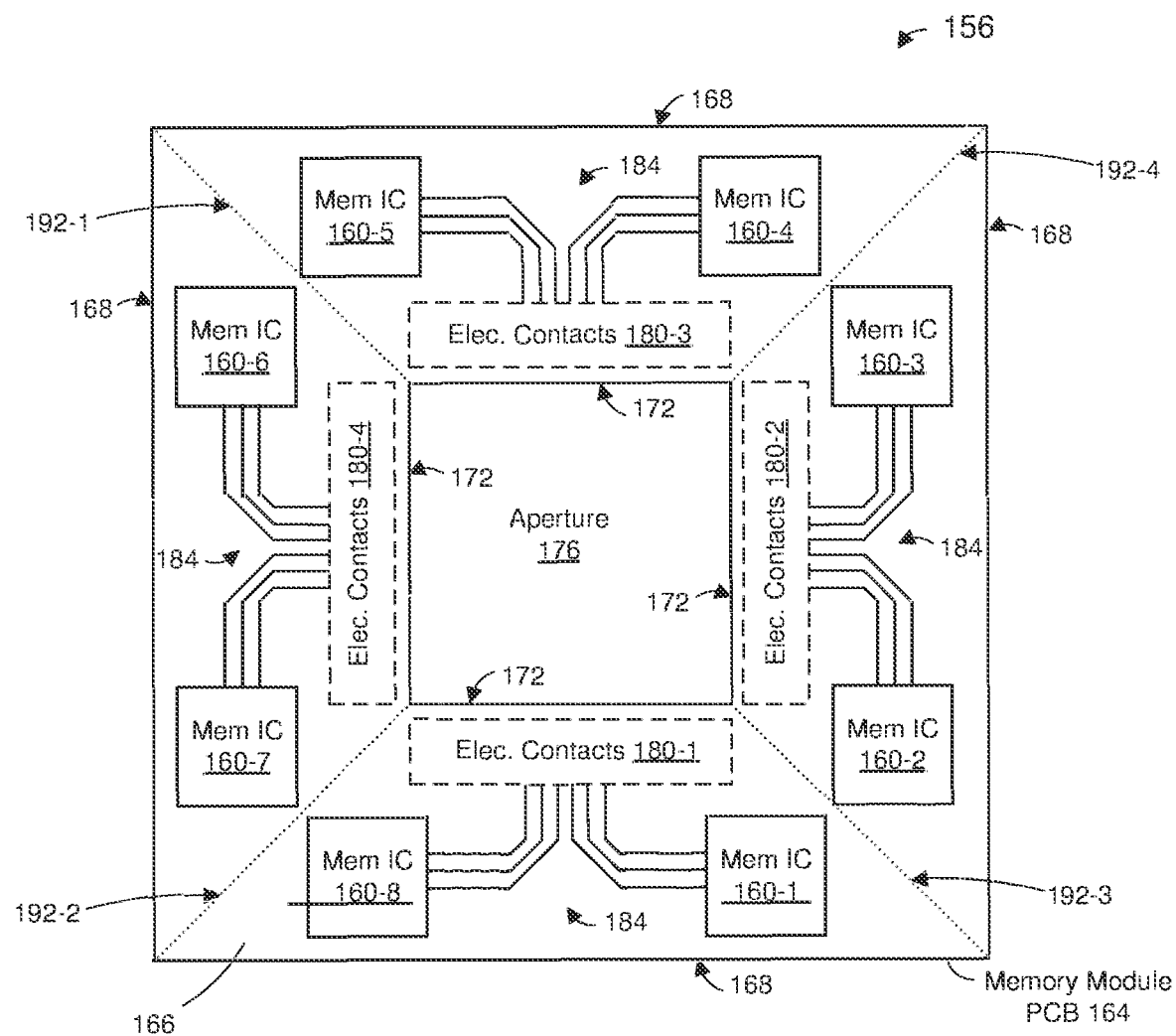
FIG. 1B is a diagram showing a top view of an example memory module that is configured to be disposed over the IC package illustrated in FIG. 1A, according to an embodiment.

FIG. 1B is a diagram showing a top view of an example memory module 156 that is configured to be mounted over the IC package 104 of FIG. 1A and electrically coupled to the IC chip 120 (FIG. 1A) via the plurality of interposers 152 (FIG. 1A), according to an embodiment.

The memory module 156 comprises one or more memory ICs 160 disposed on a PCB 164, sometimes referred to herein as a "memory module PCB 164". The memory module PCB 164 has a top surface 166 and a bottom surface (not shown). In an embodiment, the one or more memory ICs 160 are disposed on the top surface 166 of the memory module PCB 164. In another embodiment, the one or more memory ICs 160 are disposed on the bottom surface 166 of the memory module PCB 164.

In some embodiments, no processor ICs are disposed on the memory module PCB 164 and the memory module 156 omits any processor ICs. In some embodiments, no ICs other than memory ICs are disposed on the memory module PCB 164 and the memory module 156 omits any ICs other than memory ICs. In other embodiments, a processor IC is disposed on the memory module PCB 164 in addition to the one or more memory ICs 160. In some embodiments, one or more ICs other than memory ICs and processor ICs are disposed on the memory module PCB 164 in addition to the one or more memory ICs 160.

The memory module PCB 164 includes a plurality of outer edges 168, and a plurality of inner edges 172 that form an aperture 176 in the PCB memory module 164. The aperture 176 is sized to accommodate the cover 140 of the IC package 104 (FIG. 1A), as will be described in connection with FIG. 1C. The PCB memory module 164 comprises a plurality of electrical contact structures 180 disposed adjacent to the inner edges 172 of the PCB memory module 164 on the bottom surface of the memory module PCB 164. In an embodiment, the electrical contact structures 180 are disposed around the aperture 176. The electrical contact structures 180 are configured to electrically connect with the interposers 152 of the IC package 104 (FIG. 1A) when the memory module 156 is mounted over the IC package 104, as is discussed below with reference to FIG. 1C.

The memory module PCB 164 includes a plurality of wire traces 184 that electrically couple the memory ICs 160 to the electrical contact structures 180.

The memory module PCB 164 has significantly less components as compared to the main PCB 100 and thus is smaller and has less layers than the main PCB 100, according to some embodiments. As a result, a cost of the memory module PCB 164 is significantly less than the main PCB 100, according to some embodiments. Additionally, by disposing the memory ICs 160 on the memory module PCB 164 rather than on the main PCB 100, the number of layers of the main PCB 100 can be reduced (as compared to main PCBs on which the memory ICs 160 are disposed), thus reducing the cost of the main PCB 100, at least in some embodiments. Further, by disposing the memory ICs 160 on the memory module PCB 164 rather than on the main PCB 100, the memory ICs 160 can be located closer to the IC chip 120 (as compared to main PCBs on which the memory ICs 160 are disposed), thus improving performance, at least in some embodiments.

The density of the electrical contacts 180 is higher than the density of the BGA solder balls on the bottom surface of the IC package 104, according to an embodiment.

Figure 1C:
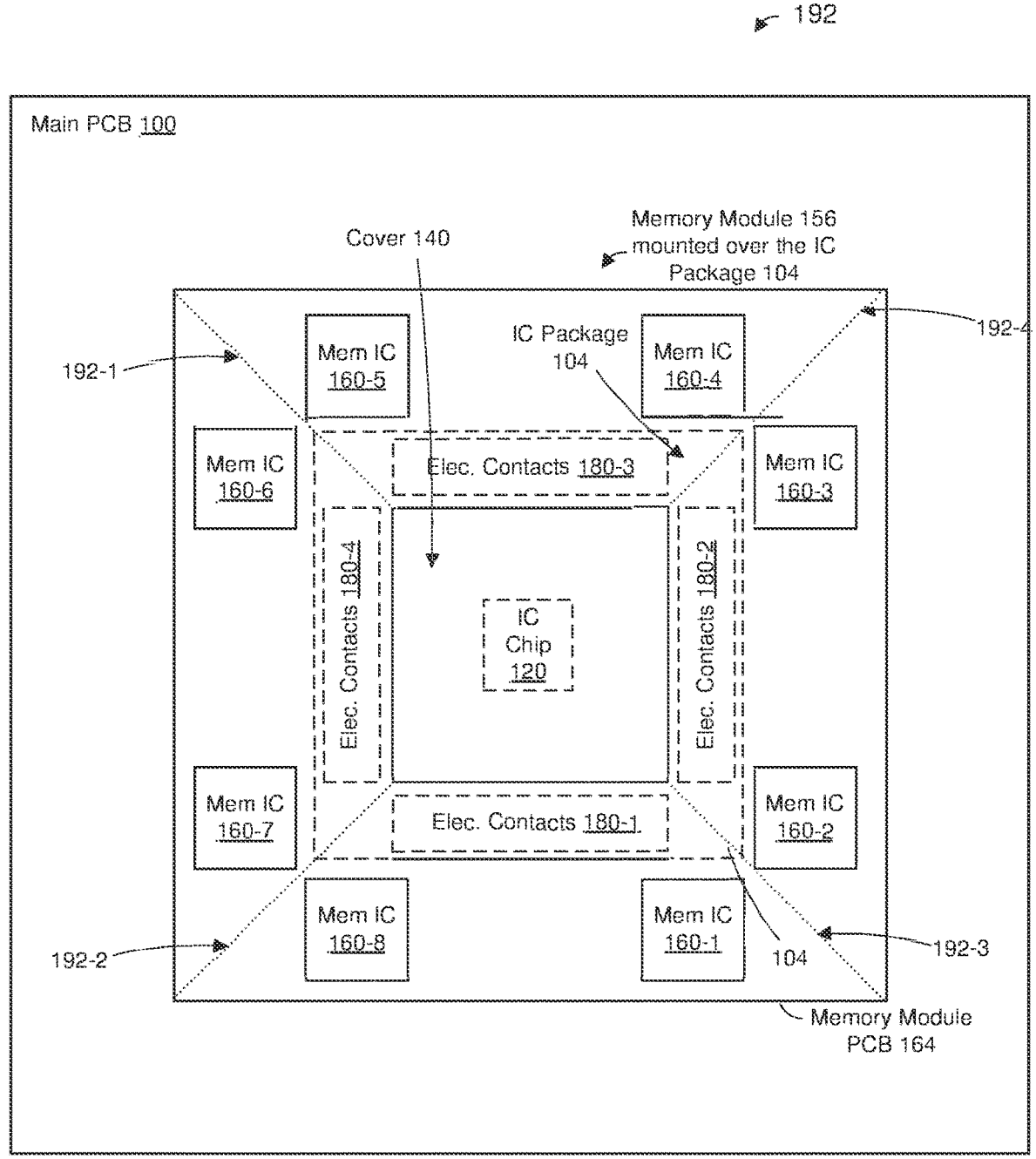
FIG. 1C is a diagram showing a top view of an example PCB system, which includes the memory module of FIG. 1B disposed over the IC package illustrated in FIG. 1A, according to an embodiment.

FIG. 1C is a diagram showing a top view of an example PCB system 192 comprising the PCB 100 of FIG. 1A, with the example memory module 156 of FIG. 1B mounted over the IC package 104, according to an embodiment. The electrical contact structures 180 are electrically connected to the interposers 152 (FIG. 1A, not shown in FIG. 1C). As a result, the second I/Os of the IC chip 120 are electrically coupled to the memory ICs 160 via the interposers 152, the electrical contact structures 180, and the wire traces 124 (FIG. 1B, now shown in FIG. 1C) of the memory module PCB 164. The cover 140 of the IC package 104 is accommodated within the aperture 176 (FIG. 1B, now shown in FIG. 1C).

Although the memory module 156 was described above as corresponding unitary module including a unitary memory module PCB 164, in other embodiments, the memory module 156 comprises a plurality of separate sub-modules each having a respective PCB, as indicated by the dotted lines 192 in FIGS. 1B and 1C.

Figure 2A:
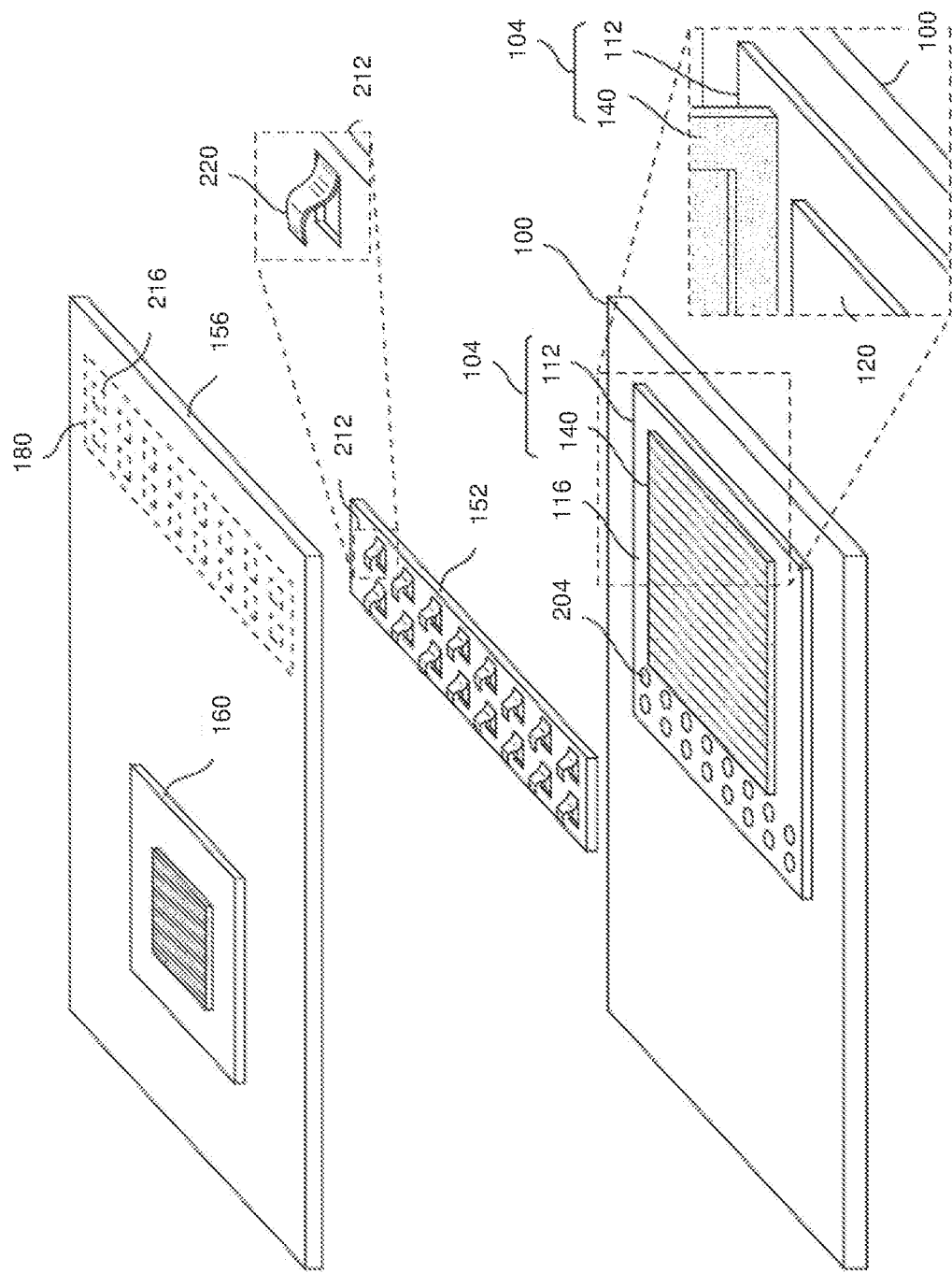
Figure 2C:
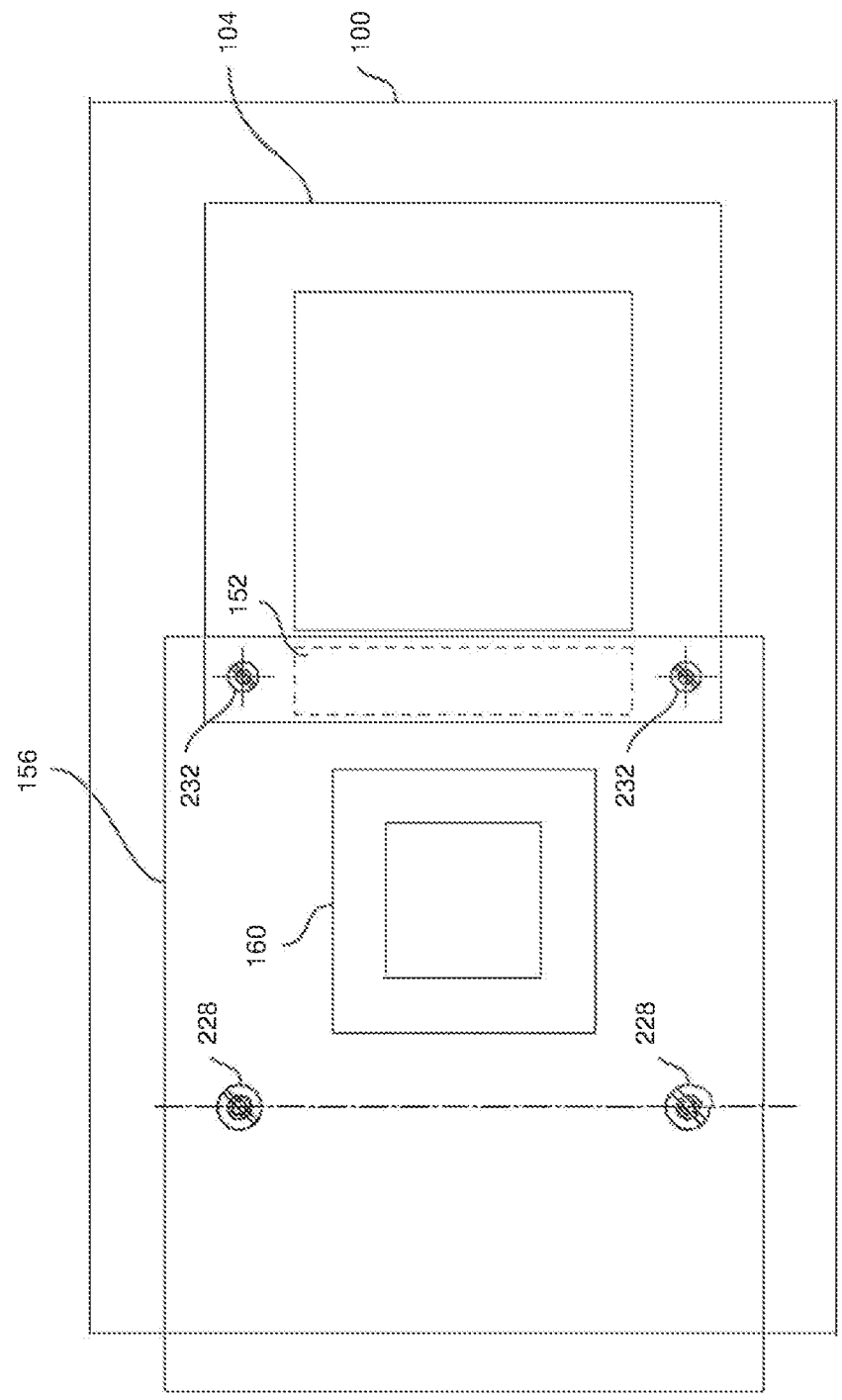

FIGS. 2A-C are different views of the PCB system 192 of FIG. 1C, but with only a section of the memory module 156 (or only a single memory sub-module) shown to aid in illustrating the PCB system 192, according to an embodiment. FIG. 2A shows a perspective view of the PCB system 192 (but with only a section of the memory module 156, or only a single memory sub-module, shown), FIG. 2B shows a cross-sectional view of the PCB system 192 (but with only a section of the memory module 156 shown), and FIG. 1C shows a top view of PCB system 192 (but with only a section of the memory module 156, or only a single memory sub-module, shown).

In the example shown in FIGS. 2A-C, the substrate 112 includes contact structures 204 formed on the top surface 116 of the substrate 112. In an embodiment, the substrate 112 includes metal traces (not shown) that electrically connect solder bumps (to which the IC chip 120 is attached) to the contact structures 204.

According to an aspect of the disclosure, the contact structures 204 and the IC chip 120 are disposed on the same surface side of the substrate 112. In some embodiments, the contact structures 204 are disposed at a peripheral area of the substrate 112 that surrounds the IC chip 120, such as the area between the cover 140 for the IC chip 120 and an edge of the substrate 112.

The contact structures 204 are any suitable contact structures. In an embodiment, each of a least some of the contact structures 204 includes a solder pad and a solder ball that is deposited on the solder pad. In another embodiment, each of a least some of the contact structures 204 includes a solder pad. In another embodiment, each of a least some of the contact structures 204 includes a pin.

In FIG. 2A, the contact structures 204 are shown as circles. In other embodiments, the contact structures 204 have other suitable shapes, such as a sphere, a square, a pin shape, etc.

The contact structures 204 are configured to enable electrical connections to other components using suitable techniques. For example, in an embodiment, the contact structures 204 are configured to make electrical connections with the electrical contacts 180 on the memory module 156 via the interposer 152.

More specifically, the interposer 152 includes a plurality of interconnection structures 212 to electrically connect corresponding contact structures 216 of the electrical contacts 180 on the memory module 156 with the contact structures 204 of the IC package 104. Each interconnection structure 212 is configured to make a first connection with a second contact structure 204 and a second connection with a contact structure 216 using suitable techniques. In an embodiment, each interconnection structure 212 is a dual compression structure that uses compression connection for the first connection and the second connection. In another embodiment, each interconnection structure 212 is a single compression structure with a solder ball that uses the solder ball for the first connection and compression connection for the second connection.

FIG. 2A includes a close up view of one side of an interconnection structure 212 that is configured for compression connection, according to an embodiment. The interconnection structure 212 includes a metal tongue 220 that protrudes from the surface of the interposer 152, and the metal tongue 220 can be pushed into the surface under a compression force, according to an embodiment. In other embodiments, other suitable interconnection structures different than the interconnection structure 212 are used.

In an embodiment, the PCB system 100 includes a force generation component that can apply a compression force to cause the interposer 152 to interconnect the memory module 156 with the contact structures 204. For example, the main PCB 100 and the memory module 156 are designed and fabricated with holes that can be aligned for disposing bolts. After the IC package 104 is mounted on the main PCB 100, the interposer 152 and the memory module 156 are aligned and stacked. It is noted that suitable spacers 224 can be inserted to level the memory module 156 on the main PCB 100. Then bolts 228 and 232 are fastened to corresponding nuts 236 and 240 to lock the stacked first PCB 110, the interposer 130 and the PCB module 140 in place, and to apply compression force to cause the interposer 152 to interconnect the contact structures 216 of the memory module 156 with the contact structures 204 of the IC package 104.

In various embodiments, the main PCB 100 and the memory module PCB 164 respectively include multiple layers of metal traces, such as copper wires, and the like disposed on a multilayered sandwich structure of dielectric material. In some examples, the main PCB 100 and the memory module PCB 164 have different number of metal layers. For example, the main PCB 100 has more metal layers than the memory module PCB 164. The memory module PCB 164 provides additional electrical connection support for the memory ICs 160 and any other suitable electronic components (if any), such as other IC packages, resistors, diodes, capacitors, transistors, etc.

According to an aspect of the disclosure, the interposer 152 has a high density and low profile. In an example, the interposer 152 has a pitch grid of 0.80 mm (e.g., smaller than a solder ball pitch for a typical BGA), and a body height of 1 mm (0.33 mm height for shortest signal path). Thus, in an example, the distance between the main PCB 100 and the memory module PCB 164 is less than a height of the IC package 104.

In an embodiment, a pitch grid of the interposer 152 is smaller than a BGA solder ball pitch requirement. In an example, the density of the contact structures 204 on the top surface 116 of the IC package 104 is higher than the density of the BGA solder balls on the bottom surface of the IC package 104. In some embodiments, the smaller pitch grid of the interposer 152 and/or the density of the contact structures 204 permits a size of the IC package substrate 112 to be reduced as compared to if the pitch grid of the interposer 152 and/or the density of the contact structures 204 were the same as the BGA solder ball pitch requirement, thus reducing the cost of the IC package 104.

In an embodiment, electrical connections from the contact structures 204 of the IC package 104 to the memory module 156 through the interposer 130 provides a relatively shorter signal path compared to other interconnection techniques, such as package plated through hole (PTH) via, PCB PTH, PCB, and the like. Thus the electrical connections from the contact structures 204 to the memory module 156 via the interposer 152 have less attenuation than the other interconnection techniques, and thus can be used for higher speed signals.

As shown in FIG. 2B, the substrate 112 includes contact structures 260 formed on a bottom surface 264 of the substrate 112. In an embodiment, the substrate 112 includes metal traces (not shown) that electrically connect solder bumps (to which the IC chip 120 is attached) to the contact structures 260. In an embodiment, the IC package 104 is a BGA package, and each of the first contact structures 260 includes a solder pad and a solder ball that is deposited on the solder pad. In another embodiment, the IC package 104 is a land grid array (LGA) package, and each of the first contact structures 260 includes a solder pad. In another embodiment, the IC package 104 is a pin grid array (PGA) package, and each of the first contact structures 260 includes a pin.

It is noted that, in some embodiments, the second contact structures 204 on the top surface 116 of the substrate 112 are implemented using a different technology from the contact structures 260 on the bottom surface 264 of the substrate 112. For example, the contact structures 260 are implemented using solder pads and solder balls, and the contact structures 204 are implemented using pads without solder, according to an embodiment.

According to an aspect of the disclosure, the contact structures 260 are respectively configured to enable electrical connections to other components using suitable techniques. In an example, the contact structures 260 are configured to enable electrical connections to the main PCB 100 using soldering techniques. For example, when the IC package 104 is mounted on the main PCB 100, a solder reflow process is performed to form solder joints, thus the contact structures 260 are connected to corresponding contact structures on the main PCB 100.

Referring now to FIGS. 1A-C and 2A-B, in some embodiments, the IC chip 120 comprises a processor (such as a packet processor for a switching device, a central processing unit (CPU), a digital signal processor (DSP), etc.), and the memory ICs 160 comprise memory devices (e.g., random access memories (RAMs), read only memories (ROMs), solid state memories such as Flash memories, etc.) that are utilized by the processor when performing processing tasks, operations, etc. The processor on the IC chip 120 accesses the memory ICs 160 via the contact structures 204, the interposers 152, and the electrical contacts 180.

Because the memory ICs 160 are disposed on the memory module 156 and the IC chip 120 can access the memory ICs 160 via the via the contact structures 204 on the top surface 116 of the package substrate 112, rather than via the contact structures 260 on the bottom surface 264 of the package substrate 112, the number of contact structures 260 on the bottom surface 264 of the package substrate 112 is reduced, which allows the size of the package substrate 112 to be reduced. The package substrate 112 is typically relatively expensive to manufacture (as compared to a typical PCB and the memory module PCB 164) and a cost of the substrate 112 increases as the size of the substrate 112 increases. Thus, reducing the size of the package substrate 112 reduces a cost of the package substrate 112, according to some embodiments. Additionally, because the memory ICs 160 are disposed on the memory module 156 and the IC chip 120 can access the memory ICs 160 via the via the contact structures 204 on the top surface 116 of the package substrate 112, rather than via the contact structures 260 on the bottom surface 264 of the package substrate 112, the number of I/Os in the BGA on the bottom side of the package substrate 112 is reduced, which reduces a number of vias in the package substrate 112 from the top side 166 of the package substrate 112 to the bottom side of package substrate. Additionally, because the number of vias passing through multiple layers of the package substrate 112, the number of layers in the package substrate 112 is reduced, at least in some embodiments. Relaxation of the number of vias required, and/or reduction of the number of layers of the package substrate 112, also reduces the cost of the package substrate 112, according to some embodiments.

Additionally, because the memory ICs 160 are disposed on the memory module 156 rather than the main PCB 100, the complexity of the main PCB 100 is also reduced, e.g., a number of layers of the PCB 100 is reduced, according to some embodiments. The cost of the PCB 100 generally increases as the number of layers increases. Thus, reducing the number of layers in the PCB 100 reduces a cost of the PCB 100, according to some embodiments.

Further, because the memory ICs 160 are disposed on the memory module 156 rather than the main PCB 100 with other components that are electrically coupled to the IC package 104, the memory ICs 160 can be located closer to the IC package 104 as compared to if the memory ICs 160 were disposed on the main PCB 100, according to some embodiments. For example, if the memory ICs 160 were disposed on the main PCB 100, the memory ICs 160 would need to be located further from the IC package 104 (as compared to the PCB system 192) to allow for routing of wire traces between the IC package 104 and other components on the main PCB 100. By locating the memory ICs more closely to the IC package 104, performance is improved, at least in some embodiments.

Figure 3:
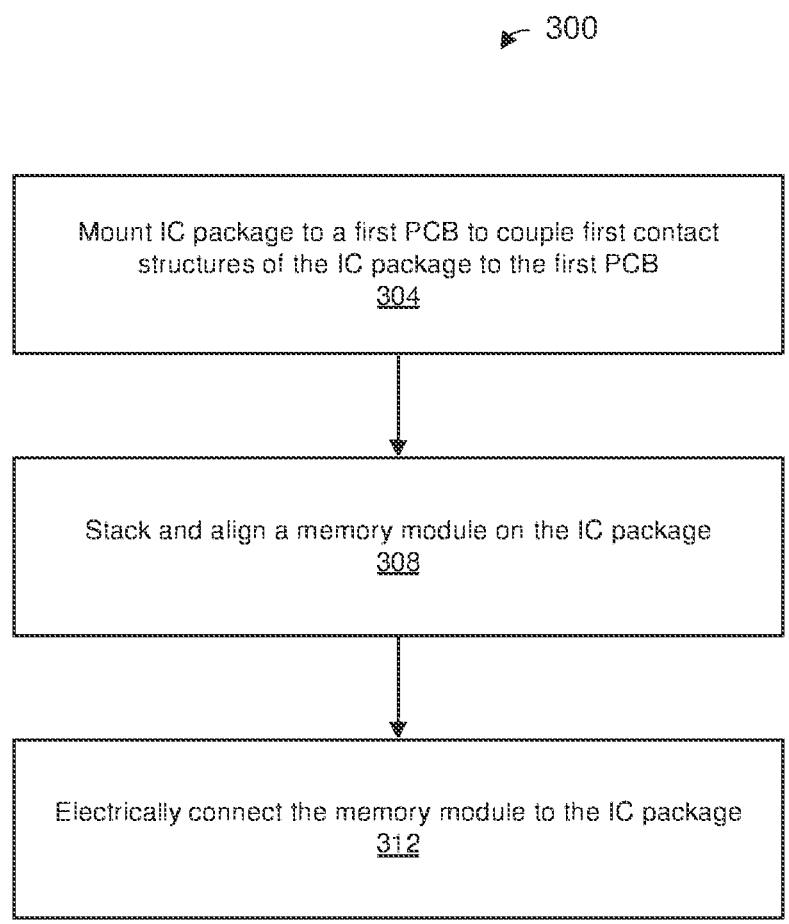
FIG. 3 is a flow diagram of an example for assembling a PCB system, according to an embodiment.

FIG. 3 is a flow diagram of an example method 300 assembling a PCB system, according to an embodiment. In an embodiment, the method 300 is performed to assemble a PCB system such as the example PCB system 192 described above with reference to FIGS. 1A-C and 2A-C, and the method 300 is described with references to FIGS. 1A-C and 2A-C merely for explanatory purposes. In other embodiments, the method 300 is performed to assemble a suitable PCB system different than the example PCB system 192.

At block 304, an IC package is mounted to a first PCB by coupling first contact structures of the IC package to the first PCB. For example, the IC package 104 is mounted on the main PCB 100, according to an embodiment. More specifically, contact structures 260 are aligned with and connected to corresponding contact structures on the main PCB 100, according to an embodiment. In an example, a solder reflow process is performed to form solder joints that form an electrical connection between the IC package 104 and the main PCB 100, with the contact structures 260 being connected to corresponding contact structures on the main PCB 100.

At block 308, a memory module is stacked on and aligned with the IC package. In an embodiment, block 308 includes disposing interposers (e.g., the interposers 152) between the memory module (e.g., the memory module 156) and the IC package (e.g., the IC package 104). In an embodiment, block 308 includes aligning the interposers 152 with contact structures 204 on the IC package 104. In an embodiment, the main PCB 100 and the memory module PCB 164 of the memory module 156 are designed and fabricated with holes that can be aligned for disposing bolts or other suitable fasteners.

At block 312, the memory module is electrically connected to the IC package. In an embodiment, electrically connecting the memory module to the IC package at block 312 comprises using mechanical fasteners press the memory module together with the IC package to apply a compression force on an interposer disposed between the memory module to the IC package. For example, bolts 112 and 114 are fastened to corresponding nuts 113 and 115 to press the main PCB 110 and the memory module 156 together to apply a force that compresses the interposer 152 causes the interposer 152 to interconnect the contact structures 216 of the memory module 156 with the contact structures 204 of the IC package 104.

It is noted that, in various embodiments, other suitable method actions can be performed before the method 300, between steps in the method 300 and/or after the method 300 for semiconductor device fabrication. As an illustrative example, the memory module 156 is mounted IC package 104 prior to mounting the IC package 104 to the main PCB 100, according to an embodiment.

Embodiment 1: A printed circuit board (PCB) system, comprising: a first PCB; an integrated circuit (IC) package comprising: i) a package substrate, ii) a main IC chip that is electrically coupled to a top surface of the package substrate, iii) first contact structures that are disposed on a bottom surface of the package substrate and that are electrically coupled to the first PCB, and iv) second contact structures that are disposed on the top surface of the package substrate; a memory module comprising: i) a second PCB, ii) one or more memory IC chips that are disposed on a top surface of the second PCB, and iii) third contact structures that are disposed on a bottom surface of the second PCB; and an interposer disposed between the second contact structures of the IC package and the third contact structures of the memory module to electrically couple the second contact structures of the IC package with the third contact structures of the memory module.

Embodiment 2: The PCB system of embodiment 1, wherein the interposer is configured to provide compression contacts on at least one side of the interposer to electrically couple the second contact structures of the IC package with the third contact structures of the memory module.

Embodiment 3: The PCB system of either of embodiments 1 or 2, wherein: the memory module comprises a plurality of separate memory sub-modules; and the second PCB comprises a plurality of separate second PCBs respectively corresponding to the plurality of separate memory sub-modules, each separate second PCB having one or more memory IC chips disposed on a top surface of the separate second PCB, and iii) a subset of the third contact structures disposed on a bottom surface of the separate second PCB.

Embodiment 4: The PCB system of either of embodiments 1 or 2, wherein the memory module comprises a unitary second PCB.

Embodiment 5: The PCB system of any of embodiments 1-4, wherein: the IC package comprises a cover that encloses the main IC chip and leaves the second contact structures disposed on the top surface of the package substrate uncovered; the second PCB of the memory module comprises i) a plurality of outer edges and ii) a plurality of inner edges that define an aperture; and wherein the cover of the IC package is disposed within the aperture defined by the plurality of inner edges of the second PCB.

Embodiment 6: The PCB system of embodiment 5, wherein: the cover that encloses the main IC chip comprises a heat slug; wherein the heat slug is disposed within the aperture defined by the plurality of inner edges of the second PCB.

Embodiment 7: The PCB system of embodiment 5, wherein: the third contact structures of the memory module are disposed on the second PCB proximate to the plurality of inner edges; and the PCB system comprises a plurality of interposers disposed around the main IC chip between the second contact structures of the IC package and the third contact structures of the memory module.

Embodiment 8: The PCB system of any of embodiments 1-7, wherein: the second contact structures of the IC package are disposed on the package substrate around the IC chip.

Embodiment 9: The PCB system of any of embodiments 1-8, wherein: the first PCB comprises a first number of layers; and the second PCB comprises a second number of layers less than the first number of layers.

Embodiment 10: The PCB system of any of embodiments 1-9, wherein: the main IC chip comprises a processor; a plurality of electrical components are disposed on the first PCB; and the processor i) interfaces with the one or more memory IC chips of the memory module via the second contact structures that are disposed on the top surface of the package substrate and the interposer, and ii) interfaces with plurality of electrical components disposed on the first PCB via the second contact structures that are disposed on the bottom surface of the package substrate.

Embodiment 11: The PCB system of any of embodiments 1-10, wherein: the first contact structures disposed on the bottom surface of the package substrate comprise ball grid array (BGA) contact structures.

Embodiment 12: The PCB system of embodiment 11, wherein: a first density of the BGA contact structures disposed on the bottom surface of the package substrate is less than a second density of the second contact structures that are disposed on the top surface of the package substrate.

Embodiment 13: A method for assembling a printed circuit board (PCB) system, comprising: mounting an integrated circuit (IC) package to a first PCB to electrically couple first contact structures on a bottom surface of a package substrate of the IC package to the first PCB, the IC package including a main IC chip; stacking and aligning a memory module on the IC package, the memory module comprising i) a second PCB, ii) one or more memory IC chips disposed on the second PCB, and iii) second contact structures disposed on a bottom surface of the second PCB; and electrically coupling the second contact structures disposed on the bottom surface of the second PCB of the memory module to third contact structures disposed on a top surface of the package substrate.

Embodiment 14: The method of embodiment 13, further comprising: disposing an interposer between the second contact structures disposed on the bottom surface of the second PCB of the memory module and the third contact structures to interconnect the second contact structures of the memory module with the third contact structures disposed on the top surface of the package substrate.

Embodiment 15: The method of embodiment 14, further comprising: applying a compression force to press the memory module and the IC package together to cause the interposer to electrically connect the second contact structures of the memory module with the third contact structures of the IC package.

Embodiment 16: The method of embodiment 15, wherein applying the compression force comprises: fastening a bolt to apply the compression force.

Embodiment 17: The method of any of embodiments 13-16, wherein: the first contact structures disposed on the bottom surface of the package substrate comprise ball grid array (BGA) contact structures; and mounting the IC package to the first PCB comprises performing a solder reflow process to connect the BGA contact structures to the first PCB.

Embodiment 18: The method of any of embodiments 13-17, wherein: the memory module comprises a plurality of separate memory sub-modules and the second PCB comprises a plurality of separate second PCBs respectively corresponding to the plurality of separate memory sub-modules, each separate second PCB having one or more memory IC chips disposed on the separate second PCB, and each separate second PCB having a subset of the second contact structures disposed on a bottom surface of the separate second PCB; stacking and aligning the memory module on the IC package comprises stacking and aligning each separate memory sub-module on the IC package; and electrically coupling the second contact structures of the memory module to the third contact structures of the package substrate comprises electrically coupling each subset of the second contact structures of each memory sub module to a respective subset of the third contact structures of the package substrate.

Embodiment 19: The method of any of embodiments 13-17, wherein: the memory module comprises a unitary second PCB with the second contact structures disposed on a bottom surface of the unitary second PCB; and electrically coupling the second contact structures of the memory module to the third contact structures of the package substrate comprises electrically coupling the second contact structures disposed on the bottom surface of the unitary second PCB of the memory module to the third contact structures of the package substrate.

Embodiment 20: The method of any of embodiments 13-19, wherein: stacking and aligning the memory module on the IC package comprises stacking and aligning, on the IC package, a memory module that omits a processor.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A printed circuit board (PCB) system, comprising:
a first PCB;
an integrated circuit (IC) package comprising: i) a package substrate, ii) a main IC chip that is electrically coupled to a top surface of the package substrate, iii) first contact structures that are disposed on a bottom surface of the package substrate and that are electrically coupled to the first PCB, and iv) second contact structures that are disposed on the top surface of the package substrate;

a heat dissipation member coupled to the main IC chip;

a memory module comprising: i) a second PCB, ii) one or more memory IC chips that are disposed on a top surface of the second PCB, and iii) third contact structures that are disposed on a bottom surface of the second PCB, the memory module being configured to electrically couple, via an interposer, the third contact structures to the second contact structures of the IC package while the heat dissipation member dissipates heat from the main IC chip away from the one or more memory IC chips; and the interposer, being disposed between the second contact structures of the IC package and the third contact structures of the memory module to electrically couple the second contact structures of the IC package with the third contact structures of the memory module while the heat dissipation member dissipates heat from the main IC chip away from the one or more memory IC chips.

2. The PCB system of claim 1, wherein the interposer is configured to provide compression contacts on at least one side of the interposer to electrically couple the second contact structures of the IC package with the third contact structures of the memory module.

3. The PCB system of claim 1, wherein:

the memory module comprises a plurality of separate memory sub-modules; and the second PCB comprises a plurality of separate second PCBs respectively corresponding to the plurality of separate memory sub-modules, each separate second PCB having one or more memory IC chips disposed on a top surface of the separate second PCB, and iii) a subset of the third contact structures disposed on a bottom surface of the separate second PCB.

4. The PCB system of claim 1, wherein the memory module comprises a unitary second PCB.

5. The PCB system of claim 1, wherein:

the second PCB of the memory module comprises i) a plurality of outer edges and ii) a plurality of inner edges that define an aperture; and the heat dissipation member is disposed within the aperture defined by the plurality of inner edges of the second PCB.

6. The PCB system of claim 5, wherein:

the third contact structures of the memory module are disposed on the second PCB proximate to the plurality of inner edges; and the PCB system comprises a plurality of interposers disposed around the main IC chip between the second contact structures of the IC package and the third contact structures of the memory module.

7. The PCB system of claim 6, wherein:

the second contact structures of the IC package are disposed on the package substrate around the IC chip.

8. The PCB system of claim 1, wherein:

the memory module is configured to electrically couple, via the interposer, the third contact structures to the second contact structures of the IC package while the heat dissipation member is laterally spaced away from the one or more memory IC chips; and the interposer is configured to electrically couple the second contact structures of the IC package with the third contact structures of the memory module while the heat dissipation member is laterally spaced away from the one or more memory IC chips.

9. The PCB system of claim 1, wherein:

the heat dissipation member comprises a cover that encloses the main IC chip and leaves the second contact structures disposed on the top surface of the package substrate uncovered.

10. The PCB system of claim 1, wherein:

the main IC chip comprises a processor;

a plurality of electrical components are disposed on the first PCB; and the processor i) interfaces with the one or more memory IC chips of the memory module via the second contact structures that are disposed on the top surface of the package substrate and the interposer, and ii) interfaces with plurality of electrical components disposed on the first PCB via the second contact structures that are disposed on the bottom surface of the package substrate.

11. The PCB system of claim 1, wherein:

the first contact structures disposed on the bottom surface of the package substrate comprise ball grid array (BGA) contact structures.

12. The PCB system of claim 11, wherein:

a first density of the BGA contact structures disposed on the bottom surface of the package substrate is less than a second density of the second contact structures that are disposed on the top surface of the package substrate.

13. A method for assembling a printed circuit board (PCB) system, comprising:

mounting an integrated circuit (IC) package to a first PCB to electrically couple first contact structures on a bottom surface of a package substrate of the IC package to the first PCB, the IC package including a main IC chip;

stacking and aligning a memory module on the IC package, the memory module comprising i) a second PCB, ii) one or more memory IC chips disposed on the second PCB, and iii) second contact structures disposed on a bottom surface of the second PCB;

disposing an interposer between the second contact structures disposed on the bottom surface of the second PCB of the memory module and third contact structures;

electrically coupling the second contact structures disposed on the bottom surface of the second PCB of the memory module to the third contact structures disposed on a top surface of the package substrate, including interconnecting the second contact structures of the memory module with the third contact structures disposed on the top surface of the package substrate via the interposer; and coupling a heat dissipation member to the main IC chip to dissipate heat from the main IC chip away from the one or more memory IC chips.

14. The method of claim 13, wherein:

the memory module comprises a unitary second PCB with the second contact structures disposed on a bottom surface of the unitary second PCB; and electrically coupling the second contact structures of the memory module to the third contact structures of the package substrate comprises electrically coupling the second contact structures disposed on the bottom surface of the unitary second PCB of the memory module to the third contact structures of the package substrate.

15. The method of claim 14, wherein:
the unitary second PCB of the memory module comprises i) a plurality of outer edges and ii) a plurality of inner edges that define an aperture; and
coupling the heat dissipation member to the main IC chip comprises coupling the heat dissipation member to the main IC chip so that the heat dissipation member is disposed within the aperture defined by the plurality of inner edges of the unitary second PCB when the second contact structures of the memory module are interconnected with the third contact structures disposed on the top surface of the package substrate via the interposer.

16. The method of claim 13, wherein:
coupling the heat dissipation member to the main IC chip comprises coupling the heat dissipation member to the main IC chip so that the heat dissipation member is laterally spaced away from the one or more memory IC chips when the second contact structures of the memory module are interconnected with the third contact structures disposed on the top surface of the package substrate via the interposer.

17. The method of claim 13, further comprising:
applying a compression force to press the memory module and the IC package together to cause the interposer to electrically connect the second contact structures of the memory module with the third contact structures of the IC package.

18. The method of claim 17, wherein applying the compression force comprises:
fastening a bolt to apply the compression force.

19. The method of claim 13, wherein:
the first contact structures disposed on the bottom surface of the package substrate comprise ball grid array (BGA) contact structures; and
mounting the IC package to the first PCB comprises performing a solder reflow process to connect the BGA contact structures to the first PCB.

20. The method of claim 13, wherein:
the memory module comprises a plurality of separate memory sub-modules and the second PCB comprises a plurality of separate second PCBs respectively corresponding to the plurality of separate memory sub-modules, each separate second PCB having one or more memory IC chips disposed on the separate second PCB, and each separate second PCB having a subset of the second contact structures disposed on a bottom surface of the separate second PCB;
stacking and aligning the memory module on the IC package comprises stacking and aligning each separate memory sub-module on the IC package; and
electrically coupling the second contact structures of the memory module to the third contact structures of the package substrate comprises electrically coupling each subset of the second contact structures of each memory sub module to a respective subset of the third contact structures of the package substrate.

\* \* \* \* \*